United States Patent [19]

Belcher et al.

[11] Patent Number: 5,351,876

[45] Date of Patent: Oct. 4, 1994

[54] APPARATUS AND METHOD FOR FLIP-CLIP BONDING

[75] Inventors: James F. Belcher, Plano; Gary W. Andrews, Dallas, both of Tex.

[73] Assignee: Texas Instruments Incorporated, Dallas, Tex.

[21] Appl. No.: 177,037

[22] Filed: Jan. 4, 1994

[51] Int. Cl.$^5$ .......................... H01L 21/60
[52] U.S. Cl. .................. 228/180.22; 228/49.1; 228/212; 269/8
[58] Field of Search .......... 269/8; 228/180.21, 180.22, 228/212, 49.1

[56] References Cited

U.S. PATENT DOCUMENTS

| | | | |
|---|---|---|---|
| 4,143,269 | 3/1979 | McCormack et al. | 250/352 |
| 4,447,291 | 5/1984 | Schulte | 156/643 |
| 4,663,529 | 5/1987 | Jenner et al. | 250/338 |
| 4,684,812 | 8/1987 | Tew et al. | 250/578 |
| 4,859,498 | 8/1989 | Yamaguchi | 269/8 |
| 4,965,649 | 10/1990 | Zanio et al. | 357/30 |
| 5,047,644 | 9/1991 | Meisnner et al. | 250/332 |
| 5,191,506 | 3/1993 | Logan et al. | 269/8 |
| 5,211,324 | 5/1993 | Fiedler | 228/212 |

FOREIGN PATENT DOCUMENTS 0090669  5/1983  European Pat. Off. ...... H01L 31/08

Primary Examiner—Kenneth J. Ramsey
Attorney, Agent, or Firm—Brian A. Carlson; James C. Kesterson; Richard L. Donaldson

[57] ABSTRACT

A bonding apparatus (40) having one or more electromagnets (60) is provided for use in coupling a first substrate (20) with flip chip type interconnections (24) to a second substrate (22) having matching flip chip type interconnections (26). The bonding apparatus (40) includes a pedestal assembly (50) which may be used to align and couple the first substrate (20) with the second substrate (22). The bonding apparatus (40) includes an electrical control system (108) with a control unit (130) for varying the amount of electrical power supplied to the electromagnet (60). One or more heater assemblies (110) are provided for temperature cycling of the substrates (20 and 22) during the bonding process. Magnetic force is used to maintain the alignment of the first substrate (20) with the second substrate (22) during temperature cycling.

20 Claims, 2 Drawing Sheets

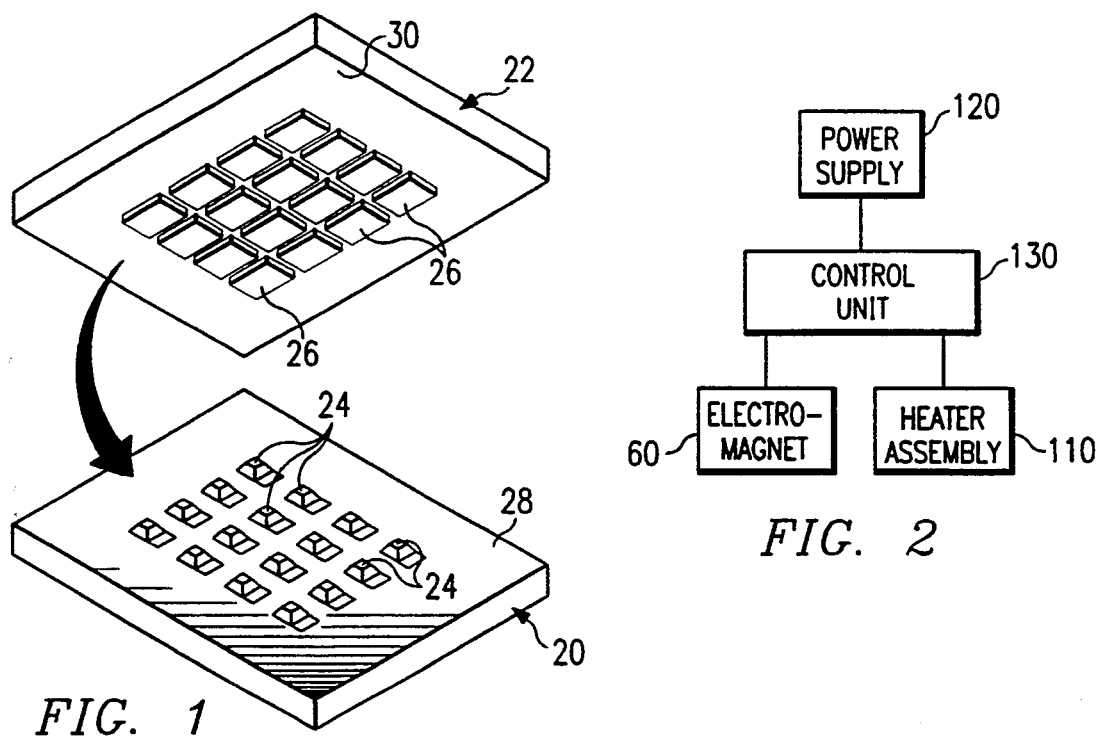
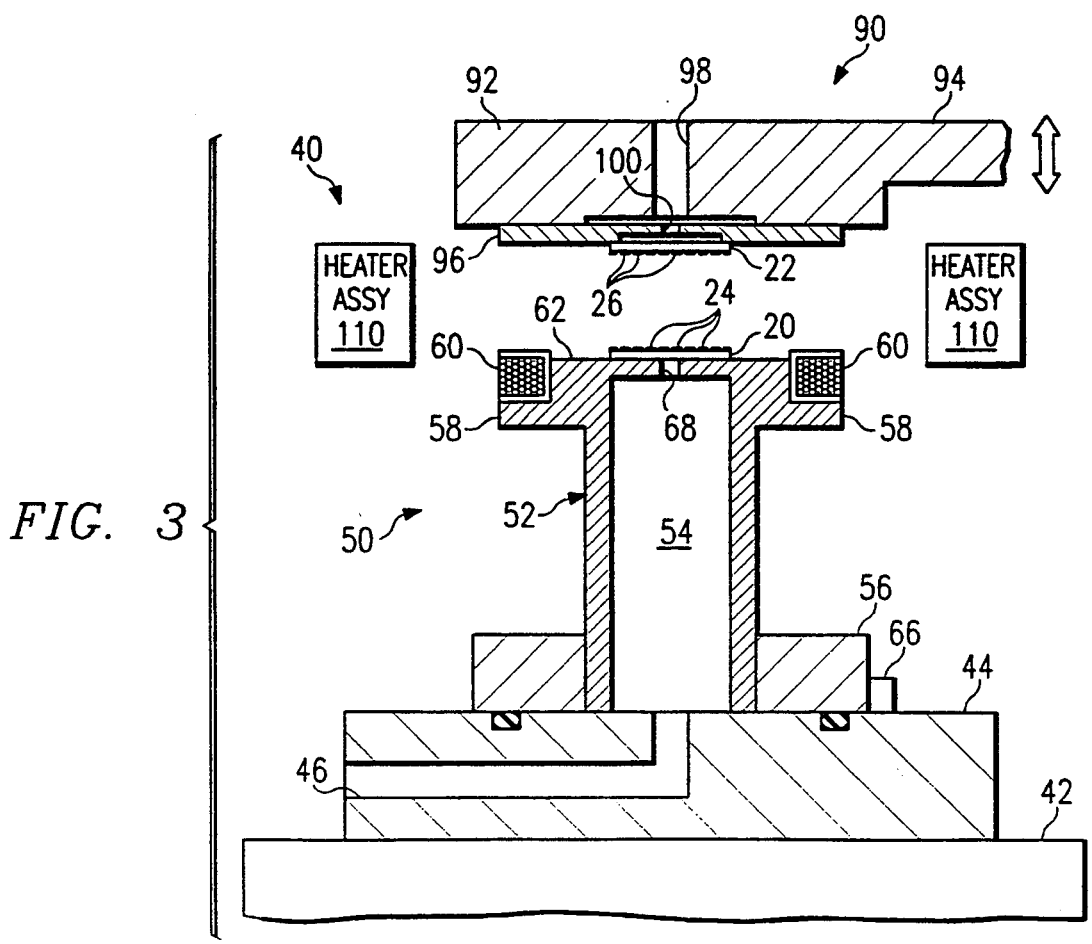

APPARATUS AND METHOD FOR FLIP-CLIP BONDING

RELATED APPLICATIONS

This application is related to co-pending application Ser. No. 08/177,038 filed Jan. 4, 1994, entitled Apparatus and Method for Flip-Chip Bonding, of the same assignee.

TECHNICAL FIELD OF THE INVENTION

This invention relates in general to flip-chip bonding of hybrid solid state systems and more particularly to thermal (infrared) imaging systems and methods of fabrication.

BACKGROUND OF THE INVENTION

Various techniques are available for electrically and mechanically connecting one substrate with another substrate to form a semiconductor device. One technique includes placing leads or terminals on one face or side of a first substrate and coupling the first substrate with matching leads or terminals on one face or side of a second substrate. Frequently, bead-like projections or bumps are formed on the face of the first substrate which is then registered with matching terminals on the second substrate and the substrates are bonded together. Various types of semiconductor substrates such as diodes, transistors and integrated circuits may be formed with their terminals on one face or one side of the substrates. Such substrates are often referred to as flip-chips and the method of coupling two flip-chip substrates is frequently referred to as flip-chip bonding.

For several years hybrid solid state systems such as infrared detectors have been successfully incorporated into integrated circuits for mass production and miniaturization. Typically, such infrared detectors are fabricated with an N×M array of infrared detector elements or thermal sensors (sometimes referred to as a focal plane array). The focal plane array is generally bonded with an integrated circuit substrate to form the thermal imaging system. Bump bonding is a common technique used to couple a focal plane array with its associated integrated circuit substrate.

One procedure used in bump bonding a focal plane array with an integrated circuit substrate includes placing the integrated circuit substrate on a heated pedestal. The focal plane array is next placed in a gimbal and aligned with the integrated circuit substrate. Frequently, the gimbal is formed as part of a pivoting arm assembly. Linear motion may also be used to move the gimbal assembly. After alignment and registration of the focal plane array with the integrated circuit substrate, the assembly may be used to apply a pre-selected amount of force to the focal plane array and integrated circuit substrate. Heat may also be applied if required to aid in the bonding process. Typically, such bonding may be performed in a vacuum environment or inert gas environment depending upon the specific bonding technique being used.

Prior bonding equipment and methods often include the use of heat lamps, resistant heaters, heated and cooled lines, and thermoelectric means to obtain the required temperature profile depending upon the type of materials used in the bonding process. Likewise, gravity, load cells, air cylinders and diaphragms have been used to provide the necessary force during the bonding process.

SUMMARY OF THE INVENTION

In accordance with the present invention, apparatus and methods are provided which substantially eliminate or reduce disadvantages and problems associated with prior flip-chip bonding equipment and techniques. The present invention allows high volume fabrication of semiconductor devices formed from two or more substrates with flip-chip type interconnections between the substrates. One aspect of the present invention includes apparatus for alignment and registration of two substrates with matching flip-chip type interconnections and applying the desired amount of force to the substrates by an electromagnet. The apparatus may also be used to maintain the desired alignment and selected force during temperature cycling of the substrates to complete the bonding process.

An important technical advantage of the present invention includes fabricating a thermal imaging system using flip-chip bonding techniques such as bump bonding to couple a focal plane array with its associated integrated circuit substrate. The bonding apparatus may include one or more electromagnets to apply a desired amount of force to the substrates. The use of electromagnets allows varying the force depending upon the type of substrates and bonding technique used to couple the substrates with each other. The bonding apparatus may also include a heater assembly for temperature cycling the substrates while maintaining the desired alignment and force on the substrates.

Another aspect of the present invention includes providing bonding apparatus which allows low cost, high volume, bump bonding of focal plane arrays with their associated integrated circuit substrates. For some applications, more than one thousand semiconductor devices may be fabricated with relatively short cycle times between alignment of the substrates, applying force to the substrates and completion of the bonding process by temperature cycling.

Another significant technical advantage of the present invention includes providing bonding apparatus which compensates for thermal expansion and contraction of two or more substrates and their associated interconnections during temperature cycling while at the same time, maintaining the desired alignment and force on the substrates.

A further significant technical advantage of the present invention includes the use of one or more electromagnets to vary the force applied to two or more substrates during a flip-chip type bonding process. The physical configuration of the electromagnets may be modified and/or the electrical power supplied to the electromagnets may be adjusted to apply the desired force to the substrates.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is an isometric drawing showing two substrates having flip-chip type interconnections which may be bonded or coupled with each other in accordance with the present invention;

FIG. 2 is a block diagram of an electrical control system for bonding the substrates of FIG. 1 in accordance with the present invention;

FIG. 3 is a schematic drawing in section with portions broken away showing apparatus including a moveable pedestal incorporating the present invention for aligning and registering two substrates such as shown in FIG. 1;

DETAILED DESCRIPTION OF THE INVENTION

Figure 4:
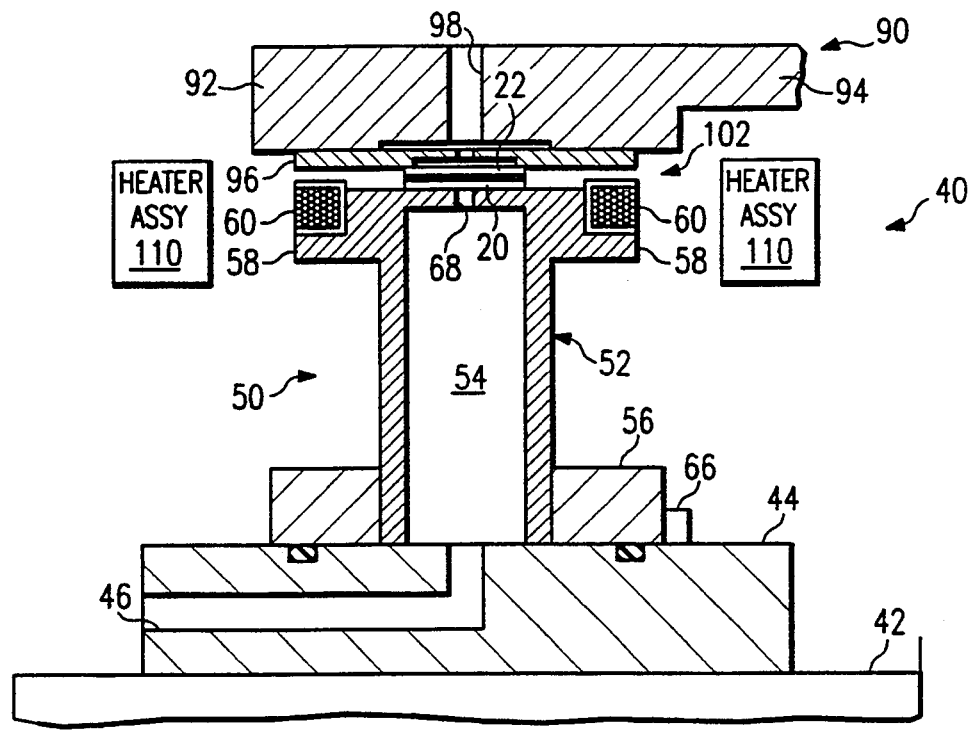
FIG. 4 is a schematic drawing in section with portions broken away showing the apparatus of FIG. 3 with the substrates of FIG. 1 in contact with each other and a selected amount of force applied to the substrates by an electromagnet.

The preferred embodiments of the present invention and its advantages are best understood by referring to FIGS. 1 through 5 of the drawings, like numerals being used for like and corresponding parts of the various drawings.

Two or more substrates are frequently coupled with each other during fabrication of semiconductor devices and hybrid solid state systems. The present invention may be used to couple or bond substrates with matching flip-chip type interconnections. The present invention may also be used to couple two or more substrates using surface type tab bonding techniques.

FIG. 1 is a schematic representation of substrates 20 and 22 which may be coupled or bonded with each other in accordance with the present invention. Substrates 20 and 22 are shown with a generally rectangle configuration. However, the present invention may be used to satisfactorily couple a wide variety of substrates and wafer configurations including, but not limited to, circular, oval and square.

For purposes of illustration and description only, reference will be made to bonding integrated circuit substrate 20 with focal plane array 22. However, various types of substrates may be bonded using the apparatus and electrical control system shown in FIGS. 2–5. Also, for some applications, more than two substrates may be simultaneously bonded using the apparatus shown in FIGS. 3–5 and related fabrication techniques incorporating the present invention. First substrate 20 may be an integrated circuit substrate (sometimes referred to as a silicon processor). Second substrate 22 may be a focal plane array associated with an infrared detector or thermal imaging system (not shown).

As will be described later in more detail, the present invention allows fabricating a thermal imaging system by bump bonding focal plane array 22 with an integrated circuit substrate 20. A thermal imaging system is only one example of the various types of semiconductor devices and hybrid solid state systems which may be fabricated using the present invention. For some applications, the present invention may be used to bond leads associated with tab type or surface mounting techniques, especially as technology allows additional geometry reductions and maintaining precise alignment during fabrication becomes increasingly critical.

Second substrate or focal plane array 22 may be formed from a plurality of thermal sensors (not shown) which function based upon the generation of a change in voltage due to a change in temperature of ferroelectric material resulting from the incident infrared radiation. Alternatively, second substrate or focal plane array 22 may be formed from a plurality of thermal sensors (not shown) which function based on the generation of electron-hole pairs resulting from the internal photoelectric effect. The present invention may be satisfactorily used to couple focal plane array 22 having either type of thermal sensor to an associated integrated circuit substrate 20.

U.S. Pat. No. 4,143,269 entitled *Ferroelectric Imaging System*, McCormack, et al., provides information concerning infrared detectors fabricated from ferroelectric materials and a silicon switching matrix or integrated circuit substrate. Second substrate 22 may be formed with a plurality of ferroelectric thermal sensors and first substrate 20 may comprise an integrated circuit substrate as shown in U.S. Pat. No. 4,143,269. U.S. Pat. No. 4,143,269 is incorporated by reference for all purposes in this patent application.

Focal plane array or second substrate 22 may also be manufactured from thermal sensors which are structured as photodiodes and/or photocapacitors. U.S. Pat. No. 4,447,291 entitled *Methods for Via Formation in HgCdTe*, issued to Eric Schulte, and U.S. Pat. No. 5,144,138 entitled *Infrared Detector and Method*, issued to Kinch, et al., provide information concerning infrared detectors fabricated from HgCdTe semiconductor materials and alloys which produce electron-hole pairs in response to incident infrared radiation. U.S. Pat. Nos. 4,447,291 and 5,144,138 are incorporated by reference for all purposes in this application.

Various types of silicon processors and/or integrated circuit substrates may also be satisfactorily used to manufacture infrared detectors in accordance with the present invention. U.S. Pat. No. 4,684,812 entitled *Switching Circuit for a Detector Array*, issued to Tew, et al., provides information concerning one type of silicon processor satisfactory for use as first substrate 20. U.S. Pat. No. 4,684,812 is incorporated by reference for all purposes in this application.

Typical bump bonding procedures for fabricating a thermal imaging system involve bringing the integrated circuit substrate and the focal plane array into initial close proximity and aligning the two substrates with respect to each other. The required amount of force is then applied to the substrates and the entire assembly is cycled to the correct temperature to obtain the desired bond between the substrates. Depending upon the bonding medium, the bonding procedure may be performed under vacuum, inert or atmospheric conditions.

Examples of bump bonds associated with thermal imaging systems are shown in U.S. Pat. No. 5,047,644 entitled *Polyamide Thermal Isolation Mesa for a Thermal Imaging System*, issued to Meissner, et al. The fabrication techniques and the materials used in U.S. Pat. No. 5,047,644 may be used in fabricating substrates 20 and/or 22. U.S. Pat. No. 5,047,644 is incorporated by reference for all purposes in this patent application.

FIG. 2 is a block diagram showing electrical control system 108 for bonding first substrate 20 with second substrate 22 in accordance with the present invention. The components of electrical control system 108 include power supply 120 and control unit 130 which regulates and adjusts the amount of electricity supplied to electromagnet 60 and/or heater assembly 110. An important feature of the present invention is the ability of control unit 130 to vary the amount of magnetic force created by electromagnet 60 and to vary the temperature associated with heater assembly 110.

As shown in FIG. 1, integrated circuit substrate 20 and focal plane array 22 comprise a plurality of metal interconnections 24 and 26 respectively. Interconnections 24 are formed on surface or side 28 of integrated circuit substrate 20. Each interconnection 24 is preferably located adjacent to a contact pad (not shown) used to provide signals to integrated circuit substrate 20. Each interconnection 26 is preferably associated with an individual thermal sensor (not shown) in focal plane array 22. Each interconnection 26 is preferably designed to mate with a corresponding interconnection 24 to allow transmission of signals from the respective thermal sensor to integrated circuit substrate 20 through a bond formed by the associated interconnections 24 and 26. Interconnections 24 and 26 may also have various configurations such as mesas with bump bonding material, via interconnections, metal connectors, or metal strip conductors.

FIGS. 3 and 4 are schematic representations of selected steps in the fabrication of a semiconductor device or hybrid solid state system from first substrate 20 and second substrate 22 in accordance with the present invention. The principal components of bonding apparatus 40 shown in FIGS. 3 and 4 include supporting structure 42, base unit 44, pedestal assembly 50 and alignment assembly 90. Pedestal assembly 50 is preferably movably disposed on its associated base unit 44. Base unit 44 cooperates with alignment assembly 90 to position pedestal assembly 50 and retainer plate 96 with respect to each other.

Pedestal assembly 50 comprises housing 52 with chamber 54 disposed therein. Housing 52 may have the general configuration of a hollow cylinder. However, for some applications, housing 52 may have a rectangular, square or other geometric configuration as desired for the specific application. For some applications, a plurality of base units 44 and their associated pedestal assemblies 50 may be disposed on supporting structure 42. An important feature of the present invention includes the ability to use base unit 44, pedestal assembly 50, and alignment or gimbal assembly 90 in cooperation with each other for high volume production.

One end of housing 52 is preferably attached to carrier 56 which may be used to position pedestal assembly 50 on base unit 44. Base unit 44 preferably includes first passageway 46 which allows communicating a vacuum from a remote source (not shown) with chamber 54. One or more o-rings 55 may be provided between carrier 56 and base unit 44 to maintain the desired fluid seal between first passageway 46 and chamber 54.

Supporting flange 58 with one or more electromagnets 60 is preferably disposed on the exterior of housing 52. End plate 62 is provided on the end of housing 52 opposite from carrier 56 adjacent to supporting flange 58. End plate 62 comprises a portion of the means for releasably holding first substrate 20 on pedestal assembly 50. One or more openings 68 are provided in end plate 62 to allow vacuum from chamber 54 to releasably hold first substrate 20 on end plate 62.

Figure 5:
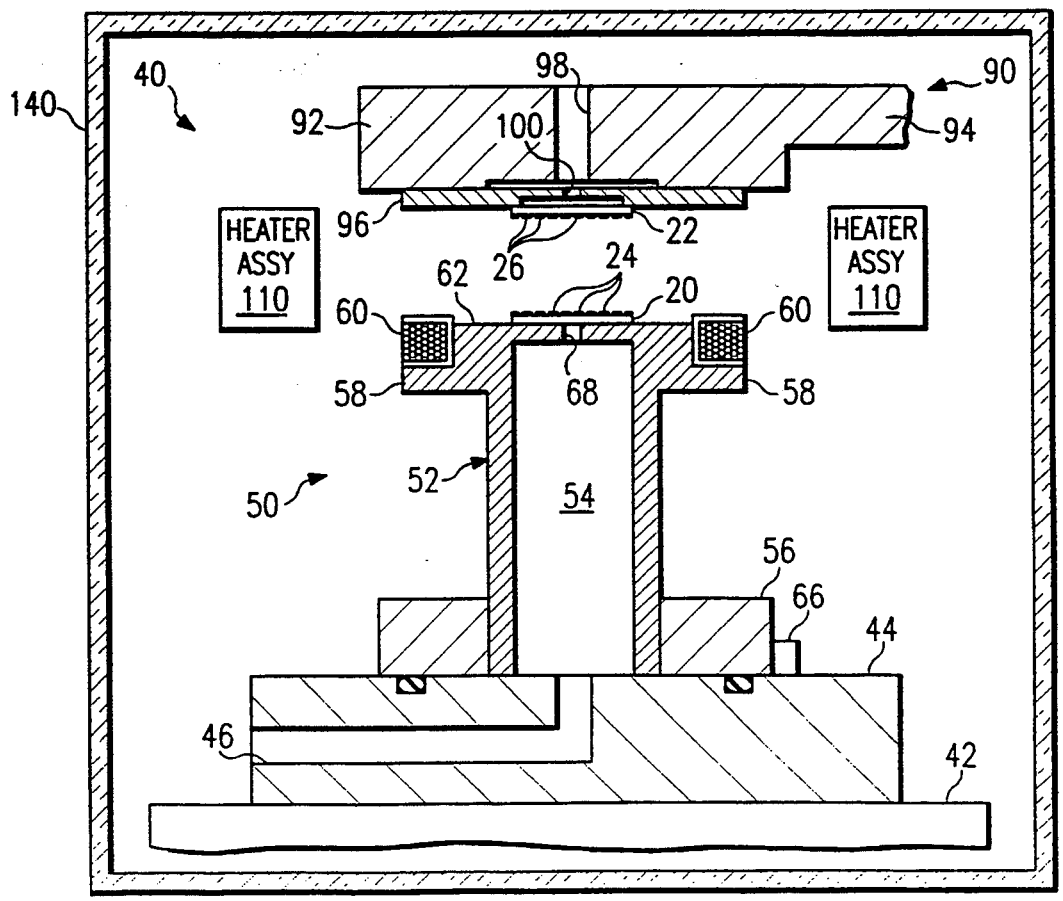
FIG. 5 is a schematic drawing in section with portions broken away showing an alternative embodiment of the present invention in which the apparatus of FIG. 3 has been disposed within a controlled environment.

For some applications of the present invention, one or more heater assemblies 110 may be disposed on the exterior of pedestal assembly 50 as shown in FIGS. 3 through 5. For other applications, heater assembly 110 may be built into end plate 62 (not shown). For still further applications, heater assembly 110 may be disposed within chamber 54. Heater assembly 110 may comprise one or more heat lamps, electrical resistance heaters, or thermoelectric heaters as desired. The present invention allows considerable flexibility in the location and type of heater assembly 110 used with bonding apparatus 40. Also, control unit 130 of electrical control system 108 allows adjusting the temperature produced by heater assembly 110 to accommodate a wide variety of bonding procedures and various types of interconnections between the associated substrates.

Alignment assembly 90 preferably includes alignment head 92 and arm 94. For some applications, alignment head 92 and arm 94 may function as a pivoting arm assembly with respect to supporting structure 42. However, various electric, pneumatic, and/or mechanical mechanisms may be used to adjust the position of alignment head 92 with respect to its associated pedestal assembly 50. Retainer plate 96 may be releasably secured to the portion of alignment head 92 facing the associated pedestal assembly 50. For some applications of the present invention, a plurality of base units 44 with their respective alignment assembly 90 and alignment head 92 may be disposed on supporting structure 42.

One or more pins 66 are preferably provided on base unit 44 for engagement with carrier 56 to position carrier 56 and its associated pedestal assembly 50 with respect to first passageway 46 of base unit 44 and alignment head 92. For some applications, alignment assembly 90 and pedestal assembly 50 may be adjusted relative to each other by the same alignment and control system (not shown). For other applications carrier 56 may remain fixed relative to base unit 44 while base unit 44 is positioned on supporting structure 42 relative to alignment head 92.

Retainer plate 96 provides a portion of the means for releasably securing second substrate 22 with alignment head 92. Retainer plate 96 and/or alignment head 92 will preferably include a gimbal assembly (not shown) which allows adjusting the position of second substrate 22 with respect to first substrate 20. Second passageway 98 is preferably provided in alignment head 90 to communicate vacuum from a remote source (not shown) to retainer plate 96 to releasably secure retainer plate 96 to alignment head 92. One or more openings 100 are provided in retainer plate 96 to allow the vacuum within second passageway 98 to releasably secure second substrate 22 with retainer plate 96. Retainer plate 96 provides a portion of the means for applying a selected amount of force to couple first substrate 20 with second substrate 22.

A typical bonding procedure using the present invention includes the following steps. First substrate 20 is placed on end plate 62 of pedestal assembly 50. Vacuum supplied from chamber 54 through opening 68 may be used to releasably hold first substrate 20 on pedestal assembly 50. Second substrate 22 is next releasably attached to retainer plate 96 and mounted on the respective alignment head 92. Vacuum from second passageway 98 and opening 100 may be used to releasably secure second substrate 22 and retainer plate 96 with alignment head 92.

Alignment assembly 90 and pedestal assembly 50 may be adjusted relative to each other using base unit 44 to establish the desired alignment between interconnections 24 and 26 on their respective substrates 20 and 22. Alignment assembly 90 may also be used to position second substrate 22 in close proximity with first substrate 20. Depending upon the type of interconnections 24 and 26, and the positioning capabilities of alignment assembly 90, substrates 20 and 22 may be positioned such that interconnections 24 and 26 physically contact each other. For other applications, interconnections 24 and 26 may be held in very close proximity to each other by alignment head 92.

After first substrate 20 and second substrate 22 have been positioned with the desired alignment relative to each other, control unit 130 is used to energize electromagnet 60 from power supply 120. Retainer plate 96 is preferably formed from material which will be attracted by electromagnet 60 when energized. The magnetic attraction between electromagnet 60 and retainer plate 96 determines the amount of force applied to first substrate 20 and second substrate 22. Control unit 130 may be used to vary the amount of electricity supplied to electromagnet 60 and thus the amount of force applied to substrates 20 and 22.

As best shown in FIG. 4, air gap 102 is preferably provided between retainer plate 96 and electromagnet 60. The dimensions of end plate 62 and supporting flange 58 cooperate to define in part the size of air gap 102 and the magnetic force applied to retainer plate 96. As previously noted, the amount of magnetic force may also be adjusted by control unit 130.

After first substrate 20 and second substrate 22 have been coupled with each other by electromagnet 60 and retainer plate 96 as shown in FIG. 4, the vacuum may be released from first passageway 46 and second passageway 98. Depending upon the type of interconnections 24 and 26, heater assembly 110 may be cycled through the desired temperature profile to complete the bonding process between first substrate 20 and second substrate 22.

As shown in FIG. 5, bonding apparatus 40 may be contained within enclosure 140 to establish the required environment depending upon the specific bonding technique used to couple first substrate 20 with second substrate 22. If interconnection 22 and 26 are formed from indium-based materials, bonding apparatus 40 will preferably be placed in either a vacuum or inert gas environment.

For many applications, interconnections 24 and 26 may be formed from indium. For other applications, various epoxy compounds may be disposed between substrates 20 and 22 to aid the bonding process in addition to interconnections 24 and 26. The temperature profile provided by heater assembly 110 and the environment within enclosure 140 will be a function of the type of interconnection and desired bonding between substrates 20 and 22.

Also, the magnetic force between electromagnet 60 and retainer plate 96 will accommodate thermal expansion and contraction of substrates 20 and 22 and their respective interconnections 24 and 26 during the temperature cycling process. Electromagnet 60, retainer plate 96, and control unit 130 cooperate to maintain the desired amount of force on interconnections 24 and 26 during thermal cycling without adversely effecting the alignment of substrates 20 and 22 with respect to each other.

The present invention is particularly beneficial for automating the process of bonding two or more substrates having flip-chip type interconnections. Bonding apparatus 40 may be used to couple a large number of first substrates 20 with their associated second substrate 22. The number of substrates coupled is dependent upon the number of pedestal assemblies 50, cycle time required for mounting each substrate 20 on the respective pedestal assembly 50 and each substrate 22 on its respective alignment head 92 plus any temperature cycling requirements.

Various metals and metal alloys may be used to form interconnections 24 and 26. Examples include indium (In), indium/lead/indium (In/Pb/In), aluminum (Al), or aluminum/titanium-tungsten (Al/TiW). The present invention may also be used to bond interconnections formed from refractory metals such as titanium, tungsten, titanium-tungsten alloys, tantalum, molybdenum and alloys such as titanium silicon (Ti$_4$Si$_3$) and titanium nitride (TiN). Electrical control system 108 with control unit 130 and electromagnet 60 may be particularly beneficial for bonding interconnections formed from refractory metals which require relatively large bonding forces.

For an alternative embodiment of the present invention, electromagnet 60 may be a plurality of electromagnets which receives electricity from power supply 120. By using one or more electromagnets 60, the magnetic force applied to retainer plate 96 may be adjusted by control unit 130 modifying the electrical power supplied to each electromagnet 60. The present invention will thus allow varying the magnetic force applied to retainer plate 96 based upon the type of substrates, their associated interconnections and the bonding procedure which will be coupled using apparatus 40.

The present invention may be used with bump bonding, soldering, epoxy bonding or any other technique used to couple flip-chip type substrates with each other. Bonding apparatus 40 may be used in an open atmospheric environment such as clean rooms associated with semiconductor fabrication or a highly controlled environment represented by enclosure 140. The requirements for forming a bond in accordance with the present invention are positioning two or more substrates on pedestal assembly 50, applying the desired amount of force to the substrates with electromagnet 60 and cycling pedestal assembly 50 with the attached substrates through the desired temperature profile. Bonding apparatus 40 may also be used with ultrasonic bonding techniques and cold welding or cold bonding procedures.

Although the present invention and its advantages have been described in detail, it should be understood that various changes, substitutions and alterations can be made therein without departing from the spirit and scope of the invention as defined by the appended claims.

What is claimed is:

1. Apparatus for use in coupling a plurality of substrates having matching flip-chip type interconnections comprising:

a pedestal for releasably holding a first substrate;

a retainer plate for releasably holding a second substrate;

an alignment assembly for positioning the retainer plate and the second substrate proximate to the first substrate on the pedestal; and an electromagnet on the pedestal for applying a selected amount of force to the retainer plate after the second substrate has been aligned with the first substrate.

2. The apparatus as defined in claim 1 further comprising the electromagnet disposed on the exterior of the pedestal.

3. The apparatus as defined in claim 1 further comprising a plurality of electromagnets disposed on the exterior of the pedestal.

4. The apparatus as defined in claim 1 further comprising an electrical control system having a control unit for varying the amount of electricity supplied to the electromagnet.

5. The apparatus as defined in claim 1 further comprising a base unit with the pedestal disposed on the base unit.

6. The apparatus as defined in claim 1 further comprising:
   a base unit having a first passageway extending therethrough;
   a chamber formed in the pedestal for communicating with the first passageway; and
   the first passageway and the chamber cooperating with each other to provide means for supplying a vacuum to releasably hold the first substrate on the pedestal.

7. The apparatus as defined in claim 1 further comprising:
   a base unit having a first passageway extending therethrough;
   a chamber formed in the pedestal with one end of the chamber open for communicating with the first passageway;
   an end plate formed on the other end of the pedestal for supporting the first substrate;
   at least one opening in the end plate communicating with the chamber; and
   the first passageway, the chamber, and the opening cooperating with each other to provide means for supplying a vacuum to hold the first substrate on the pedestal.

8. The apparatus as defined in claim 1 wherein the alignment assembly further comprises:
   an alignment head having a second passageway extending therethrough;
   the retainer plate having at least one opening extending therethrough; and
   the second passageway and the opening in the retainer plate cooperating with each other to provide means for supplying a vacuum to releasably hold the second substrate and the retainer plate on the alignment head.

9. The apparatus as defined in claim 1 further comprising:
   the first substrate having a plurality of bump bond type interconnections; and
   the second substrate having a plurality of bump bond type interconnections corresponding with the bump bond interconnections on the first substrate.

10. The method of coupling a first substrate having a plurality of flip-chip type interconnections extending from one surface of the first substrate with a second substrate having a plurality of corresponding flip-chip type interconnections comprising the steps of:
    releasably attaching one of the substrates to a pedestal assembly having an electromagnet disposed on the pedestal assembly;
    releasably attaching the second substrate to a retainer plate;
    aligning the first substrate and the second substrate in close proximity with each other; and
    supplying electrical power to the electromagnet to establish a selected amount of force between the electromagnet and the retainer plate to hold the interconnections of the first substrate coupled with the interconnections of the second substrate.

11. The method of coupling substrates as defined in claim 10 further comprising the steps of:
    cycling the temperature of a heater assembly associated with the pedestal assembly as required to complete bonding of the interconnections of the first and second substrates with each other; and
    maintaining the selected amount of force and alignment of the substrates by cooperation between the electromagnet and the retainer plate during the temperature cycling step.

12. The method of coupling substrates as defined in claim 10 further comprising the step of varying the amount of electrical power to correspond with the desired amount of force for bonding the interconnections of the first substrate and the second substrate.

13. The method of coupling substrates as defined in claim 10 further comprising the steps of:
    supplying a vacuum to the pedestal assembly for releasably attaching one of the substrates to the pedestal assembly; and
    supplying a vacuum to releasably attach the second substrate to the retainer plate.

14. Apparatus for use in coupling a focal plane array with an integrated circuit substrate during fabrication of a thermal imaging system comprising:
    a pedestal assembly for releasably holding the integrated circuit substrate;
    a retainer plate for releasably holding the focal plane array;
    an alignment assembly for positioning the retainer plate and the focal plane array proximate to the integrated circuit substrate on the pedestal assembly; and
    an electromagnet disposed on the pedestal assembly for applying a selected amount of force to the retainer plate after alignment of the focal plane array with the integrated circuit substrate.

15. The apparatus as defined in claim 14 further comprising a plurality of electromagnets disposed on the exterior of the pedestal assembly.

16. The apparatus as defined in claim 14 further comprising:
    a supporting flange disposed on the exterior of the pedestal assembly; and
    at least one electromagnet mounted on the supporting flange.

17. The apparatus as defined in claim 14 wherein the pedestal assembly further comprises:
    an end plate providing a portion of the means for releasably holding the integrated circuit substrate on the pedestal assembly; and
    a chamber formed in the pedestal assembly and an opening extending through the end plate to allow communication with the chamber.

18. The apparatus as defined in claim 14 further comprising:
    a base unit having a first passageway extending therethrough;
    a chamber formed in the pedestal assembly for communicating with the first passageway;
    the pedestal assembly disposed on the base unit; and
    the first passageway and the chamber cooperating with each other to provide means for applying a vacuum to releasably hold the first substrate on the pedestal assembly.

19. The apparatus as defined in claim 14 further comprising:

a base unit having a first passageway extending therethrough;

a chamber formed in the pedestal assembly with one end of the chamber open for communicating with the first passageway;

an end plate formed on the other end of the pedestal for supporting the first substrate;

at least one opening in the end plate communicating with the chamber; and the first passageway, the chamber, and the opening cooperating with each other to provide means for supplying a vacuum to releasably hold the first substrate on the end plate.

20. The apparatus as defined in claim 14 wherein the alignment assembly further comprises:

an alignment head having a passageway extending therethrough;

the retainer plate having at least one opening extending therethrough; and the passageway in the alignment head and the opening in the retainer plate cooperating with each other to provide means for supplying a vacuum to releasably hold the second substrate and the retainer plate on the alignment head.

* * * * *